(12) United States Patent
Huang

(10) Patent No.: US 6,187,624 B1
(45) Date of Patent: Feb. 13, 2001

(54) METHOD FOR MAKING CLOSELY SPACED CAPACITORS WITH REDUCED PARASITIC CAPACITANCE ON A DYNAMIC RANDOM ACCESS MEMORY (DRAM) DEVICE

(75) Inventor: Jenn Ming Huang, Hsin-Chu (TW)

(73) Assignee: Taiwan Semiconductor Manufacturing Company, Hsin-Chu (TW)

( * ) Notice: Under 35 U.S.C. 154(b), the term of this patent shall be extended for 0 days.

(21) Appl. No.: 09/325,954

(22) Filed: Jun. 4, 1999

(51) Int. Cl.$^7$ ................................................ H01L 21/8242
(52) U.S. Cl. .......................................... 438/253; 438/396
(58) Field of Search .............................................. 438/239

(56) References Cited

U.S. PATENT DOCUMENTS

| | | | |
|---|---|---|---|
| 5,811,331 | 9/1998 | Ying et al. | 438/253 |
| 5,851,877 | 12/1998 | Ho et al. | 438/253 |
| 5,858,829 | 1/1999 | Chen | 438/238 |
| 5,858,869 | 1/1999 | Chen et al. | 438/597 |
| 5,888,866 * | 3/1999 | Chien | 438/254 |
| 6,060,352 * | 5/2000 | Sekiguchi et al. | 438/253 |
| 6,072,210 * | 6/2000 | Choi | 257/303 |
| 6,077,743 * | 6/2000 | Chen | 438/255 |

* cited by examiner

Primary Examiner—Charles Bowers
Assistant Examiner—William M. Brewster
(74) Attorney, Agent, or Firm—George O. Saile; Stephen B. Ackerman

(57) ABSTRACT

A method for making DRAM devices having reduced parasitic capacitance between closely spaced capacitors is achieved. After forming FETs for the memory cells and bit lines having bit-line contacts, a planar insulating layer is formed having an etch-stop layer thereon. Contact openings are etched in the insulating layer and are filled with polysilicon to make contact to capacitor node contact plugs. A relatively thick insulating layer having a low dielectric constant (k) is deposited, and an array of recesses are etched over the node contact plugs for crown-shaped capacitors. A polysilicon layer and an inter-electrode dielectric layer are formed in the array of recesses, and another polysilicon layer is patterned to complete the crown capacitors. The low-k insulator between adjacent capacitors reduces the parasitic capacitance and improves data retention of DRAM cells. Alternatively, higher density of memory cells can be formed without increasing parasitic capacitance.

26 Claims, 9 Drawing Sheets

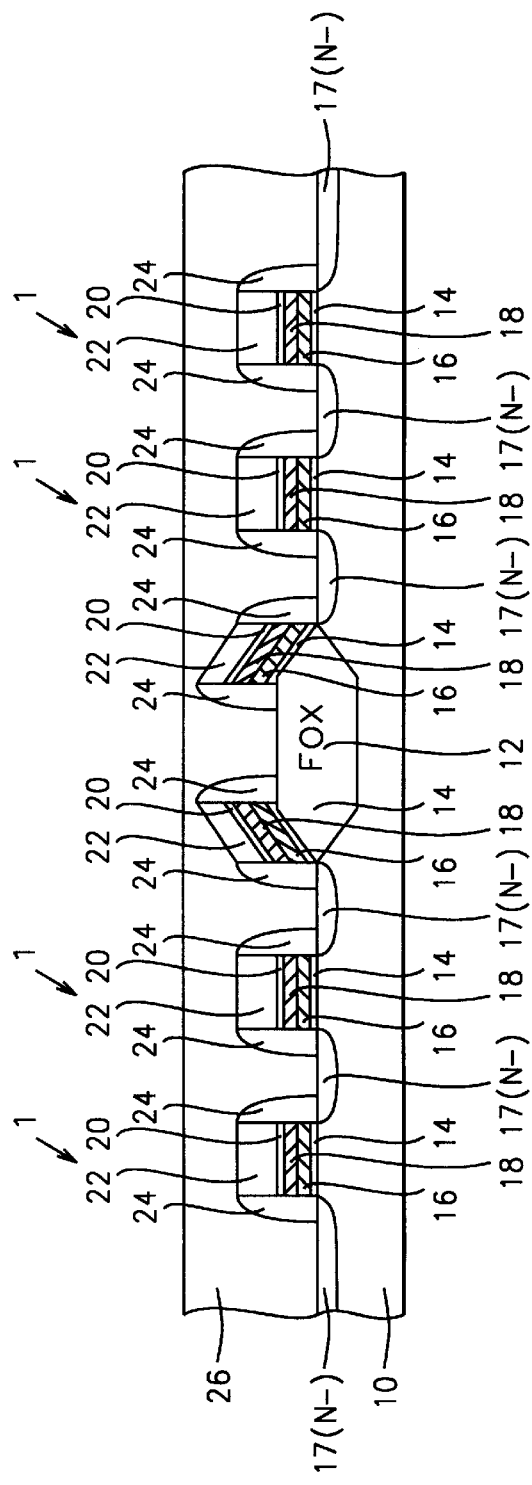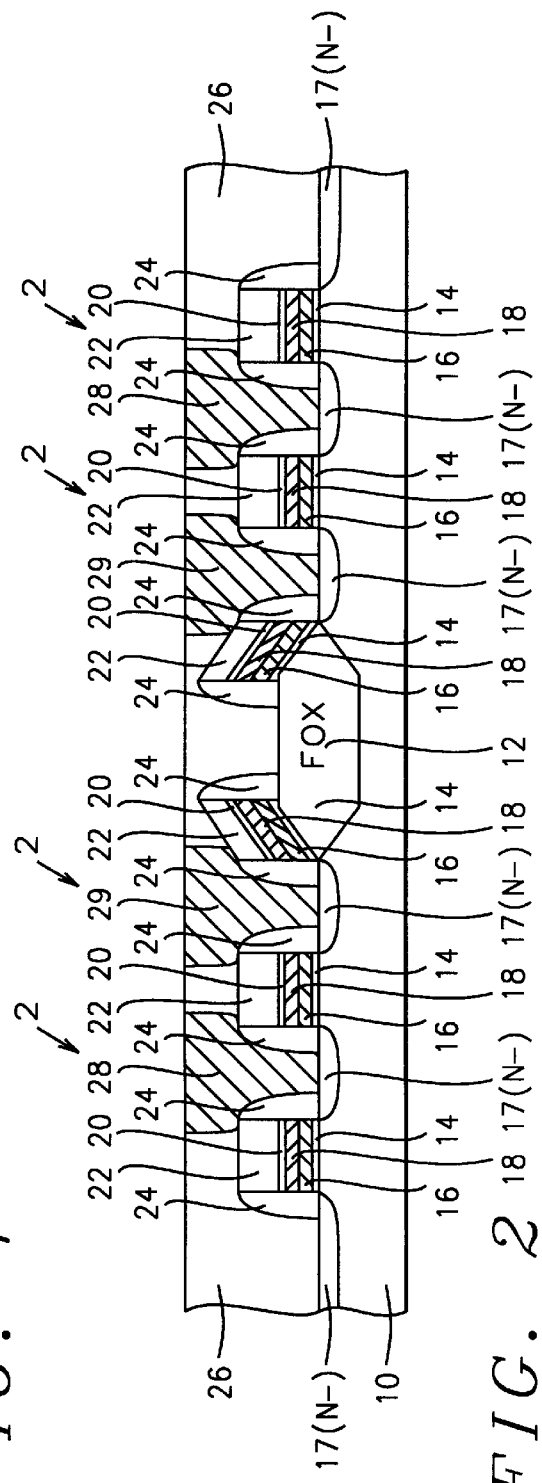
FIG. 1
FIG. 2

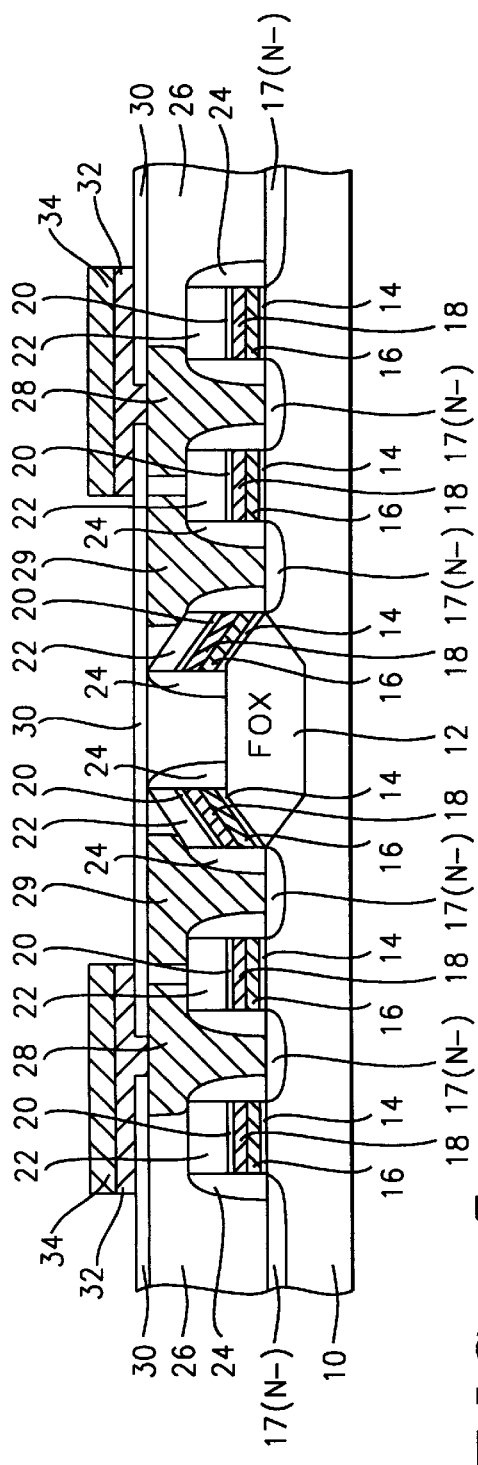
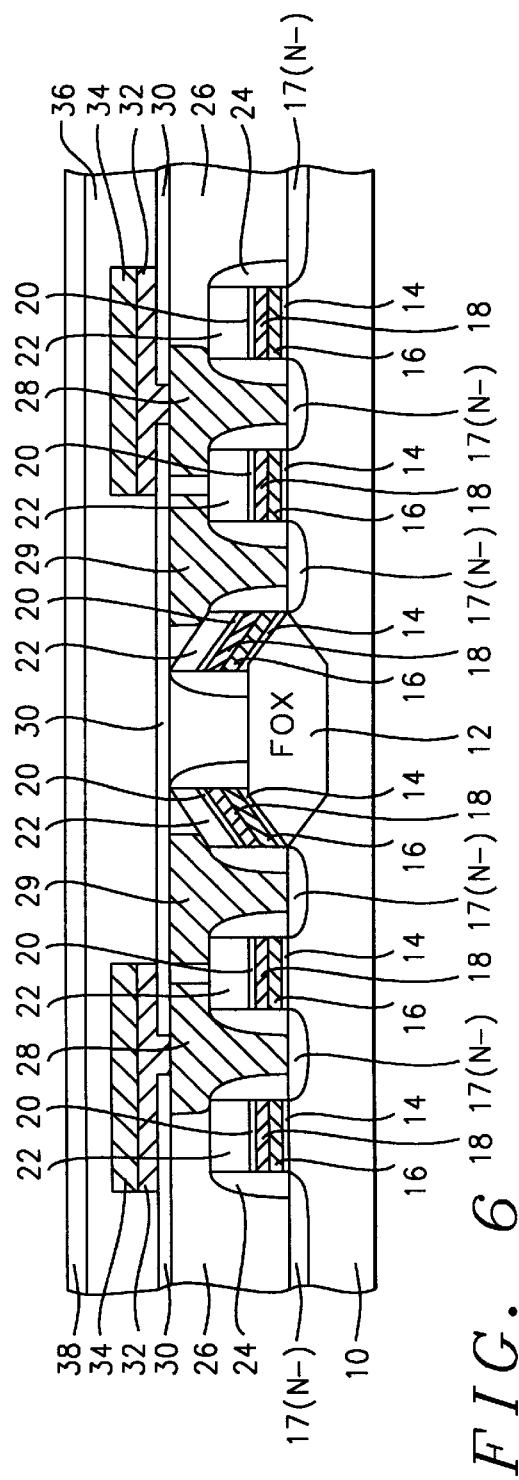

METHOD FOR MAKING CLOSELY SPACED CAPACITORS WITH REDUCED PARASITIC CAPACITANCE ON A DYNAMIC RANDOM ACCESS MEMORY (DRAM) DEVICE

BACKGROUND OF THE INVENTION

1. Field of the Invention

The present invention relates to integrated circuits, and more particularly to a method for fabricating an array of DRAM cells with closely spaced capacitors having reduced parasitic capacitance between adjacent capacitors, and DRAM embedded in integrated circuits.

2. Description of the Prior Art

Dynamic random access memory (DRAM) circuits (devices) are used extensively in the electronics industry, and more particularly in the computer industry for storing data in binary form (1s and 0s) as charge on a storage capacitor. These DRAM devices are made on semiconductor substrates (or wafers) and then the substrates are diced to form the individual DRAM circuits (or chips). Each DRAM circuit (chip) consists in part of an array of individual memory cells that store binary data (bits) as electrical charge on the storage capacitors. Further, the information is stored and retrieved from the storage capacitors by means of switching on or off a single access transistor (via word lines) in each memory cell using peripheral address circuits, while the charge stored on the capacitors is sensed via bit lines and by read/write circuits formed on the peripheral circuits of the DRAM chip.

The access transistor for the DRAM device is usually a field effect transistor (FET), and the single capacitor in each cell is formed either in the semiconductor substrate as a trench capacitor, or is built over the FET in the cell area as a stacked capacitor. To maintain a reasonable DRAM chip size and improved circuit performance, it is necessary to further reduce the area occupied by the individual cells on the DRAM chip, and to move the adjacent capacitors on memory cells closer together. Unfortunately, as the cell size decreases, it becomes increasingly more difficult to fabricate stacked or trench storage capacitors with sufficient capacitance to store the necessary charge to provide an acceptable signal-to-noise level for the read circuits (sense amplifiers) to detect. The reduced charge also requires more frequent refresh cycles that periodically restore the charge on these volatile storage cells. This increase in refresh cycles further reduces the performance (speed) of the DRAM circuit. As cell density increases and cell area decreases, it is also necessary to make the capacitors closer together. This results in increased parasitic capacitance between adjacent capacitors and can disturb the data retention (charge) on the capacitor.

Since the capacitor area is limited to the cell size in order to accommodate the multitude of cells on the DRAM chip, it is necessary to explore alternative methods for increasing the capacitance while decreasing the lateral area that the capacitor occupies on the substrate surface. In recent years the method of choice is to build stacked capacitors in the vertical direction over the access transistors within each cell area to increase the capacitance of the individual capacitors by increasing the capacitor area in the vertical direction. However, when these vertical stacked capacitors are formed by making bottom electrodes in recesses in an insulating layer (having dielectric constant k), the increase in parasitic capacitance between adjacent capacitors can adversely affect the data retention.

The unwanted parasitic capacitance $C_p$ ($C_p = kA/d$) between capacitors increases because of their close proximity (decreasing spacing d), and because the effective area A also increases between adjacent capacitors.

Several methods have been reported that increase the capacitance of the individual capacitors, but do not address the problem associated with the parasitic capacitance $C_p$ due to the close proximity of adjacent capacitors. For example, in U.S. Pat. No. 5,811,331 to Ying et al., a method is taught for making cylindrical capacitors with improved void-free insulation and better photolithographic overlay tolerances. In U.S. Pat. No. 5,851,877 to Ho et al., a method of making crown-shaped capacitors is described in which the formation of a polymer residue on the sidewalls of the bottom electrodes during etching is utilized as an etch mask. In U.S. Pat. No. 5,858829 to Chen, a method is described for making cylindrical-shaped capacitors self-aligned to bit lines formed from electrically conducting sidewall spacers (split bit line) that reduces cell area. Still another method for reducing RC time constant by reducing the capacitance C is taught in U.S. Pat. No. 5,858,869 to Chen et al., in which a low-dielectric-constant (low-k) oxide and polymer are used between metal lines (interconnections).

Although there has been considerable work done to increase the capacitor area on these miniature stacked capacitors, there is still a need to fabricate an array of DRAM cells with minimum parasitic capacitance between adjacent capacitors. This will become exceptionally important as the cell area decreases on future gigabit DRAM circuits anticipated for production after the year 2000.

SUMMARY OF THE INVENTION

A principal object of the present invention is to fabricate capacitor-over-bit line (COB) DRAM cells with closely spaced capacitors having reduced parasitic capacitance between closely spaced capacitors.

Another object of this invention is to utilize an insulator having a low dielectric constant (low-k) between the closely spaced capacitors on adjacent memory cells to reduce the parasitic capacitance and to improve the charge retention time on the capacitors.

Still another objective of this invention is to provide a very manufacturable process that allows openings to be etched selectively in the low-k insulator for forming the DRAM capacitors.

The method for making an array of closely spaced stacked capacitors with reduced parasitic capacitance between adjacent capacitors on a DRAM device begins by providing a semiconductor substrate. Typically the substrate is a single-crystal silicon substrate doped with a P type conductive dopant, such as boron (B). A relatively thick Field OXide (FOX) is formed surrounding and electrically isolating an array of device areas on the substrate. The field oxide is typically formed using the LOCal Oxidation of Silicon (LOCOS) method, in which a patterned silicon nitride ($Si_3N_4$) layer is used to mask the device areas from oxidation while the silicon substrate in the FOX areas is thermally oxidized to the desired thickness. Other field oxide isolations can also be used, such as shallow trench isolation (STI) and the like. A thin gate oxide is then formed in the device areas of the silicon substrate for making semiconductor devices such as field effect transistors (FETs). Typically a polycide (poly-silicon/silicide) layer, having a cap layer (optional) consisting of silicon oxide ($SiO_2$) and silicon nitride ($Si_3N_4$) thereon, is patterned to form the FET gate electrodes and the interconnecting word lines for the array of memory cells on the DRAM device. The lightly doped source/drain regions are formed adjacent to the FET gate electrodes using ion implantation. A spacer silicon nitride ($Si_3N_4$) layer is deposited and anisotropically etched back to form spacers on the sidewalls of the gate electrodes and completes the FETs for the memory cells.

Continuing, a first insulating layer is deposited over the device areas and the FOX areas. The first insulating layer is composed of $SiO_2$ and is deposited by low-pressure chemical vapor deposition (LPCVD). The first insulating layer is then planarized, for example by chemical/mechanical polishing (CMP).

First contact openings for bit lines and for capacitor node contacts are etched in the first insulating layer to the source/drain areas. The first contact openings are etched extending over the gate electrodes, and are etched selectively to the $Si_3N_4$ cap layer and sidewall spacers to form self-aligned contacts (SAC). A conductively doped first polysilicon layer is deposited by LPCVD on the first insulating layer and is sufficiently thick to fill the first openings. The first polysilicon layer is etched back to the planar first insulating layer to form bit-line plugs to electrically contact the first source/drain areas, and to concurrently form capacitor node contact plugs to electrically contact the second source/drain areas. A $SiO_2$ second insulating layer is deposited over the first insulating layer and over the bit-line plugs and over the capacitor node contact plugs. Second openings for bit lines are etched in the second insulating layer to the bit-line plugs. Next, a polycide layer, composed of a doped polysilicon layer and a refractory metal silicide layer, is deposited over the second insulating layer. The polycide layer is patterned to form the bit lines over the bit-line plugs.

A third insulating layer, such as $SiO_2$, is deposited over the bit lines and is planarized by chemical-mechanical polishing (CMP). A $Si_3N_4$ etch-stop layer is deposited by LPCVD on the third insulating layer. Third openings are etched in the etch-stop layer and in the third and second insulating layers to the capacitor node contact plugs. A second conductively doped polysilicon layer is deposited sufficiently thick to fill the third openings and is chemically-mechanically polished or plasma etched back to the etch-stop layer to form polysilicon plugs in the third openings to the capacitor node contact plugs.

Now, a key feature of this invention is to deposit a fourth insulating layer that has a low dielectric constant (low-k). For example, the low-k material can be a fluorosilicate glass (FSG), a fluorinated amorphous carbon (FLAC), a porous oxide such as nanofoams, and the like. This low-k dielectric material reduces the parasitic capacitance between the closely spaced stacked capacitors and reduces the disturbance of the data retention (electrical charge on the capacitor) of the neighboring DRAM memory cells. Next, an array of recesses is etched in the fourth insulating layer over and to the polysilicon plugs contacting the capacitor node contact plugs. A conformal first conducting layer, such as a doped polysilicon, is deposited and polished back to the surface of the fourth insulating layer to form capacitor bottom electrodes in the recesses. A thin interelectrode dielectric layer having a high dielectric constant (high-k), such as $SiO_2/Si_3N_4/SiO_2$ (ONO), is deposited on the bottom electrodes. A second conducting layer, such as a doped polysilicon, is deposited and patterned to form capacitor top electrodes to complete the array of capacitors. A fifth insulating layer is deposited to electrically insulate the array of capacitors on the DRAM device prior to subsequent processing to complete the DRAM device.

BRIEF DESCRIPTION OF THE DRAWINGS

The objects and advantages of this invention are best understood with reference to the attached drawings and the embodiment that follows.

FIGS. 1 through 12 show schematic cross-sectional views for two adjacent memory cell regions on a DRAM device showing in detail the fabrication steps for making capacitor-over-bit line (COB) DRAM cells with closely spaced capacitors having reduced parasitic capacitance.

DESCRIPTION OF THE PREFERRED EMBODIMENT

Figure 3:
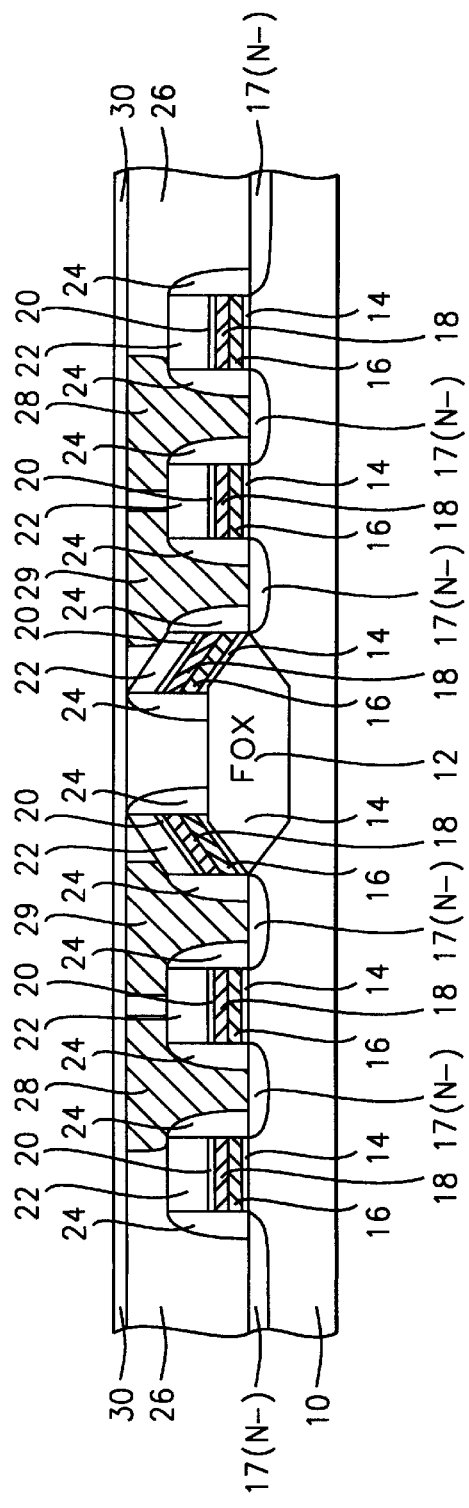

The method for making these DRAM devices having capacitor-over-bit line (COB) DRAM cells having reduced parasitic capacitance between adjacent capacitors is now described in detail. However, it should also be well understood by one skilled in the art that by including additional process steps, in addition to those described in this embodiment, other types of devices can also be included on the DRAM chip. For example, by forming N-well regions in a P doped substrate, P-channel FETs can also be provided from which Complementary Metal-Oxide-Semiconductor (CMOS) circuits can also be formed, such as are used for the peripheral circuits on the DRAM chip.

Referring now to FIG. 1, a schematic cross-sectional view of a portion of a semiconductor substrate 10 is shown having two partially completed DRAM cells. The preferred substrate 10 is composed of a lightly doped P type single-crystal silicon having a <100> crystallographic orientation. A relatively thick Field OXide (FOX) 12 is formed to surround and electrically isolate the individual device regions in which the memory cells are built. The field oxide 12, which is only partially shown in FIG. 1 between the two cell areas, is most commonly formed by the LOCal Oxidation of Silicon (LOCOS) method. Briefly the LOCOS method uses a thin $SiO_2$ (pad oxide) as a stress release layer, and a thicker silicon nitride ($Si_3N_4$) layer that serves as an oxidation barrier layer on the pad oxide on the substrate surface (not shown in FIG. 1). Also not depicted in the drawings, conventional photolithographic techniques and etching are used to remove the $Si_3N_4$ barrier layer in areas where a field oxide is required, while retaining the $Si_3N_4$ over the active device areas to prevent oxidation. The silicon substrate 10 is then thermally oxidized to form the field oxide areas 12, as shown in FIG. 1. The field oxide is usually grown to a thickness of between about 2000 and 5000 Angstroms. The $Si_3N_4$ barrier layer and pad oxide are removed in a wet etch, such as in a hot phosphoric acid ($H_3PO_4$) etch for removing the $Si_3N_4$, and in a dilute hydrofluoric acid and water ($HF/H_2O$) solution for removing the pad oxide. Other field oxide isolation methods can be used which allow even more closely spaced device areas and higher cell density. For example shallow trench isolation (STI) and the like can be used with this invention.

Still referring to FIG. 1, the semiconductor devices are then formed in the active device areas. The most commonly used device for DRAMs is the field effect transistor (FET) having an oxide gate. These devices are formed by first thermally oxidizing the active device areas to form a thin gate oxide 14 having a preferred thickness of between about 50 and 100 Angstroms. An appropriately doped polysilicon layer 16 and a refractory metal silicide layer 18 are deposited on the substrate 10. A cap layer, consisting of a $SiO_2$ layer 20 and a $Si_3N_4$ layer 22, is deposited, and layers 22, 20, 18, and 16 are patterned to form FET gate electrodes with the insulating cap layer (20 and 22). Typically the polysilicon layer 16 is deposited by low-pressure chemical vapor deposition (LPCVD) to a thickness of between about 500 and 2000 Angstroms, and is doped with arsenic or phosphorus for N-channel FETs. The silicide layer 18 is typically tungsten silicide ($WSi_x$), deposited by CVD using tungsten hexafluoride ($WF_6$) and silane ($SiH_4$), and is deposited to a thickness of between about 500 and 2000 Angstroms. The cap layer is formed by depositing an optional CVD $SiO_2$ layer 20 to a thickness of between about 100 and 300 Angstroms, and the $Si_3N_4$ layer 22 is deposited by LPCVD to a thickness of between about 1000 and 2500 Angstroms. After forming the gate electrodes 1 by conventional photolithographic techniques and anisotropic plasma etching, lightly doped source/drain areas 17($N^-$) are formed adjacent to the gate electrodes 1 by ion implanting an N type dopant such as arsenic ($As^{75}$) or phosphorus ($p^{31}$). Next, sidewall spacers 24 are formed on the sidewalls of the polycide gate electrodes 1 by depositing a $Si_3N_4$, for example by LPCVD using $SiCl_2H_2$ and $NH_3$, and anisotropically etching back in a reactive ion etcher (RIE). Typically, source/drain contact areas are formed in the peripheral area of the DRAM chip by using a block-out mask and a second ion implantation. However, they do not appear in the memory cell areas, and therefore are not shown in the Figs.

The remainder of this embodiment relates more specifically to the invention. Continuing with FIG. 1, a first insulating layer 26, preferably composed of $SiO_2$, is deposited over the device areas and the field oxide areas 12. For example, layer 26 can be deposited by LPCVD using tetraethosiloxane (TEOS) as the reactant gas, and is deposited to a thickness of between about 3000 and 8000 Angstroms. The first insulating layer 26 is then planarized. One method of globally planarizing layer 26 is to use chemical/mechanical polishing (CMP) using an appropriate polishing slurry.

Referring to FIG. 2, first contact openings 2 for bit lines and for capacitor node contacts are etched in the first insulating layer 26 to the source/drain areas 17($N^-$) on the substrate. The first contact openings are etched extending over the gate electrodes 1. The contact openings 2 are etched preferably using a high-density-plasma (HDP) etcher and an etchant gas mixture that etches the $SiO_2$ layer 26 selectively to the $Si_3N_4$ cap layer 22 and to the $Si_3N_4$ sidewall spacers 24 to form self-aligned contacts (SAC). This selective etching is achieved using a fluorine-based etchant gas mixture such as $C_4F_8$ and $CH_2F_2$ that provides an etch-rate ratio of $SiO_2$ to $Si_3N_4$ of about 10:1.

Still referring to FIG. 2, a conductively doped first polysilicon layer is deposited on the first insulating layer 26, and is sufficiently thick to fill the first openings 2. The first polysilicon layer is then etched back or chem/mech polished back to the planar first insulating layer 26 to form bit-line plugs 28 to electrically contact the first source/drain areas 17($N^-$), and to concurrently form capacitor node contact plugs 29 to electrically contact the second source/drain areas, also labeled 17($N^-$). The first polysilicon layer is deposited preferably by LPCVD using $SiH_4$ as the reactant gas, and is in-situ doped with phosphorus to a concentration of between about 1.0 E 19 and 1.0 E 21 atoms/$cm^3$ using phosphine ($PH_3$) as the dopant gas. The first polysilicon layer can be etched back using plasma etching and a chlorine-based ($Cl_2$) etchant gas that selectively etches the polysilicon back to the $SiO_2$ layer 26.

Referring to FIG. 3, a second insulating layer 30 is deposited over the first insulating layer 26 and over the bit-line plugs 28 and over the capacitor node contact plugs 29. Layer 30 is preferably $SiO_2$, deposited by LPCVD to a thickness of between about 500 and 2000 Angstroms. The $SiO_2$ layers 26 and 30 together are commonly referred to in the industry as an interpolysilicon oxide-1 (IPO-1) layer.

Figure 4:
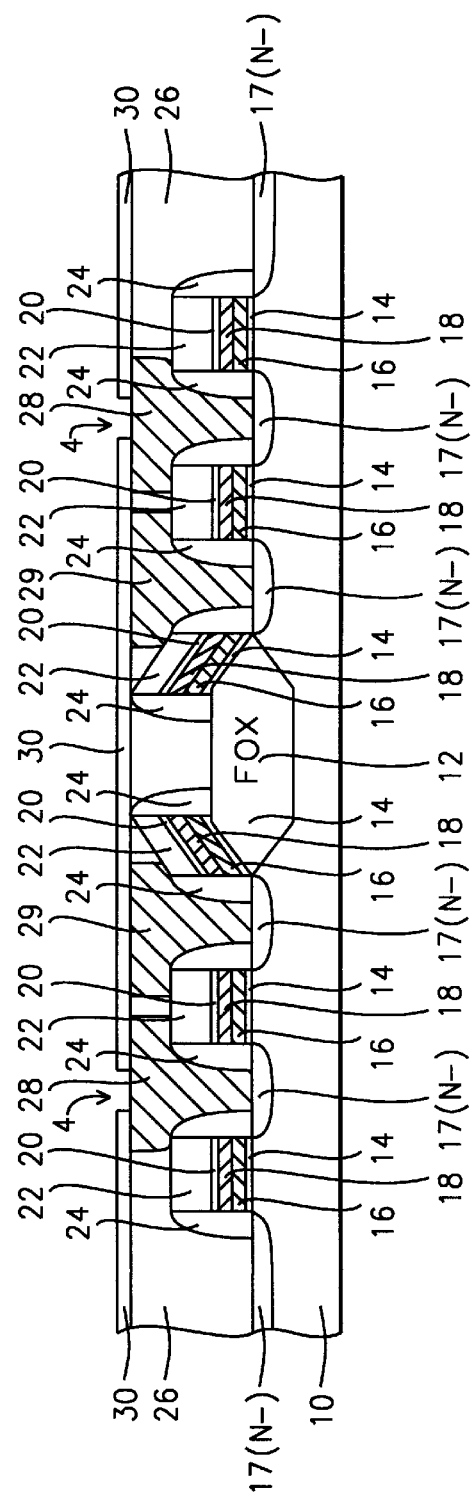

Referring to FIG. 4,, second openings 4 for bit lines are etched in the second insulating layer 30 to the bit-line plugs 28. Conventional photolithographic techniques and anisotropic plasma etching are used to etch the openings 4. The openings are etched using RIE and a fluorine-based etchant gas mixture.

Referring to FIG. 5, the bit lines are formed by depositing a polycide layer composed of a doped polysilicon layer 32 and a refractory metal silicide layer 34 over the second insulating layer 30. The polysilicon layer 32 is deposited by LPCVD to a thickness of between about 300 and 1000 Angstroms and is doped with phosphorus to a concentration of between about 1.0 E 19 and 1.0 E 23 atoms/$cm^3$. The refractory metal silicide layer 34, preferably composed of tungsten silicide ($WSi_x$), is now deposited on the polysilicon layer 32 by LPCVD using tungsten hexafluoride ($WF_6$) and $SiH_4$ as the reactant gases. Layer 34 is deposited to a thickness of between about 500 and 2000 Angstroms. The polycide layer (32 and 34) is then patterned using a photoresist mask and RIE with an chlorine-based gas mixture to form the bit lines over the bit-line plugs 28.

Referring to FIG. 6, a third insulating layer 36, such as $SiO_2$, is deposited over the bit lines and is planarized by chem/mech polishing to provide a globally planar surface having a thickness of between about 3000 and 6000 Angstroms over the bit lines. Next, an etch-stop layer 38 is deposited on the third insulating layer 36. Layer 38 is preferably $Si_3N_4$, deposited by plasma-enhanced CVD using, for example, silane ($SiH_4$) and ammonia ($NH_3$) as the reactant gases, and at a deposition temperature of about 250 to 350° C. The thickness of the etch-stop layer 38 is between about 40 and 100 Angstroms, and more specifically about 50 Angstroms.

Figure 7:
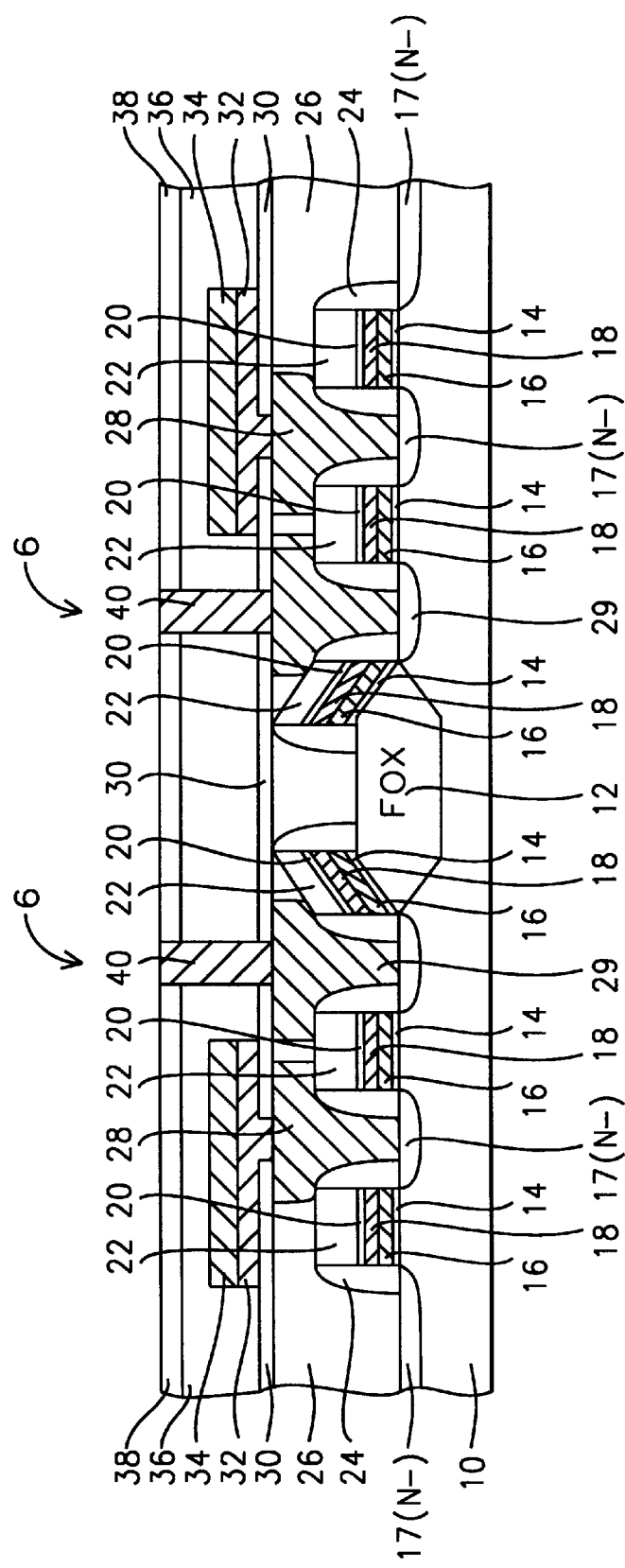

Referring to FIG. 7, openings 6 for contacts are etched in the etch-stop layer 38 and in the third and second insulating layers 36 and 30 to the capacitor node contact plugs 29, which are also commonly referred to as landing pads. Conventional photolithographic techniques and anisotropic etching are used to etch the openings 6. The etching can be carried out using RIE and a fluorine-based etchant gas mixture.

Still referring to FIG. 7, a second conductively doped polysilicon layer 40 is deposited sufficiently thick to fill the third openings 6 and is chem/mech polished or plasma etched back to the etch-stop layer 38 to form polysilicon plugs 40 in the third openings 6 to make electrical contact to the capacitor node contact plugs 29. Second polysilicon layer 40 is deposited by LPCVD and is insitu doped with phosphorus to a concentration of between about 1.0 E 19 and 1.0 E 23 atoms/$cm^3$.

Figure 8:
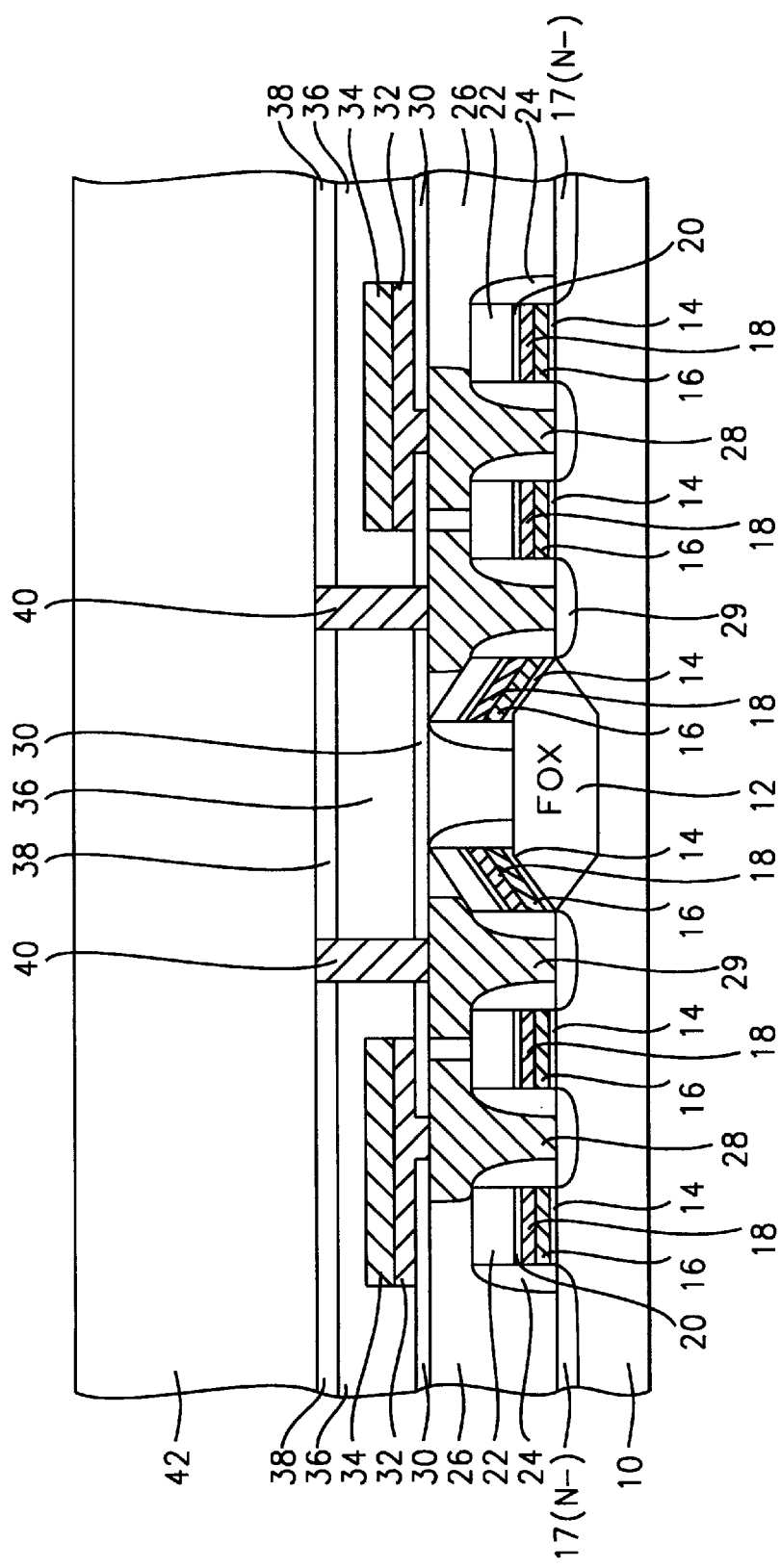

Referring now to FIG. 8, and a key feature of this invention is to deposit a relatively thick fourth insulating layer 42 that has a low dielectric constant (low-k) on the etch-stop layer 38 and over the polysilicon contacts 40. The low-k material can be a fluorosilicate glass (FSG). For example, the FSG can be deposited by LPCVD using TEOS and by introducing a fluorine-containing dopant gas such as carbon tetrafluoride ($CF_4$). Another low-k material that can be used is a spin-on dielectric (SOD) material, such as hydrogen silsesquioxane (HSQ) that is baked and cured. The low-k fourth insulating layer 42 is deposited to a thickness of between about 5000 and 12000 Angstroms, and more specifically to a thickness of about 10000 Angstroms.

Figure 9:
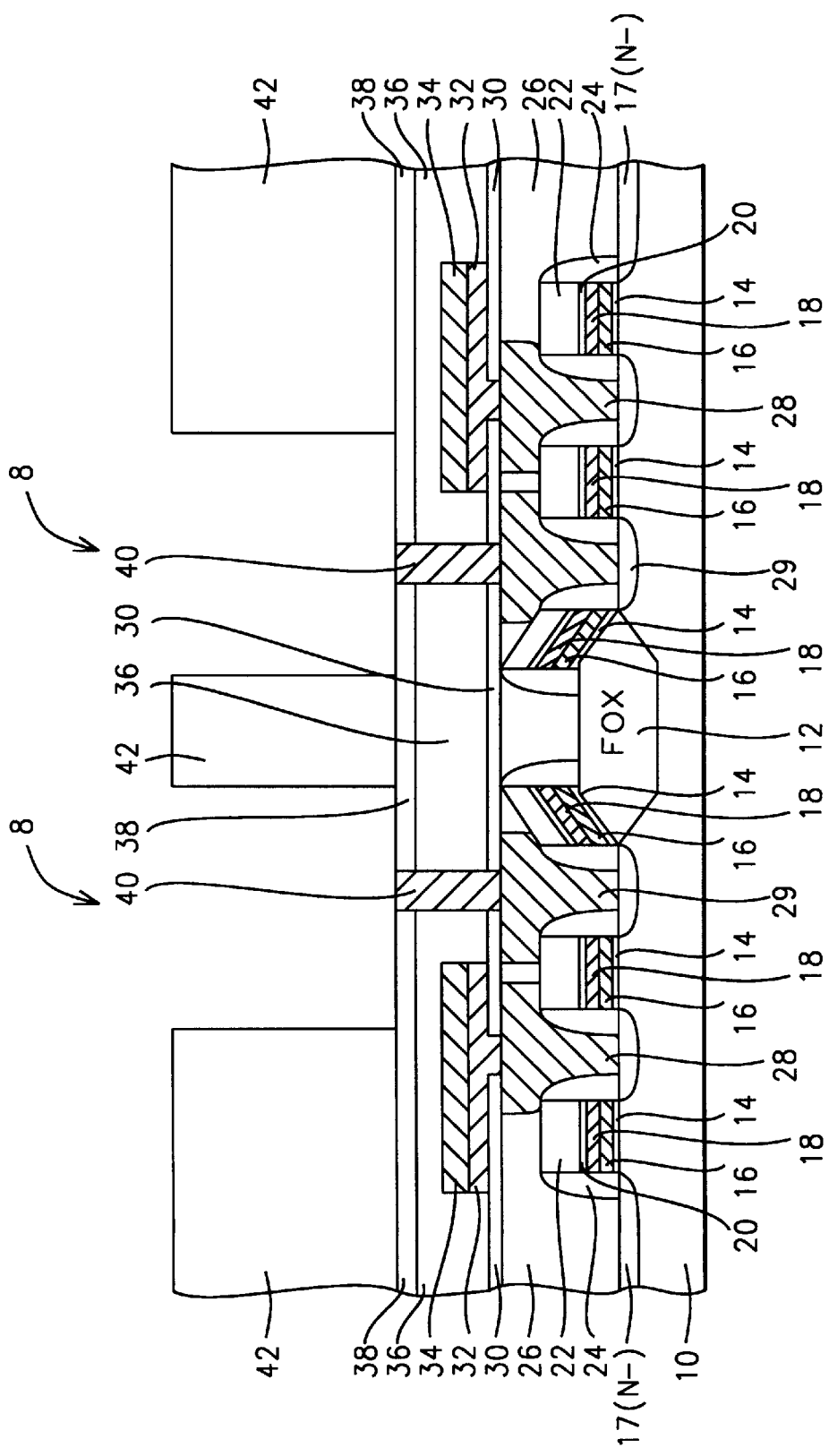

Referring to FIG. 9, an array of recesses 8 for crown capacitors is etched in the low-k fourth insulating layer 42 over and to the polysilicon plugs 40 contacting the capacitor node contact plugs 29. The recesses 8 are etched using a photoresist mask and anisotropic plasma etching. The recesses are etched selectively to the etch-stop layer 38 using RIE and a fluorine-based etchant gas mixture.

Figure 10:
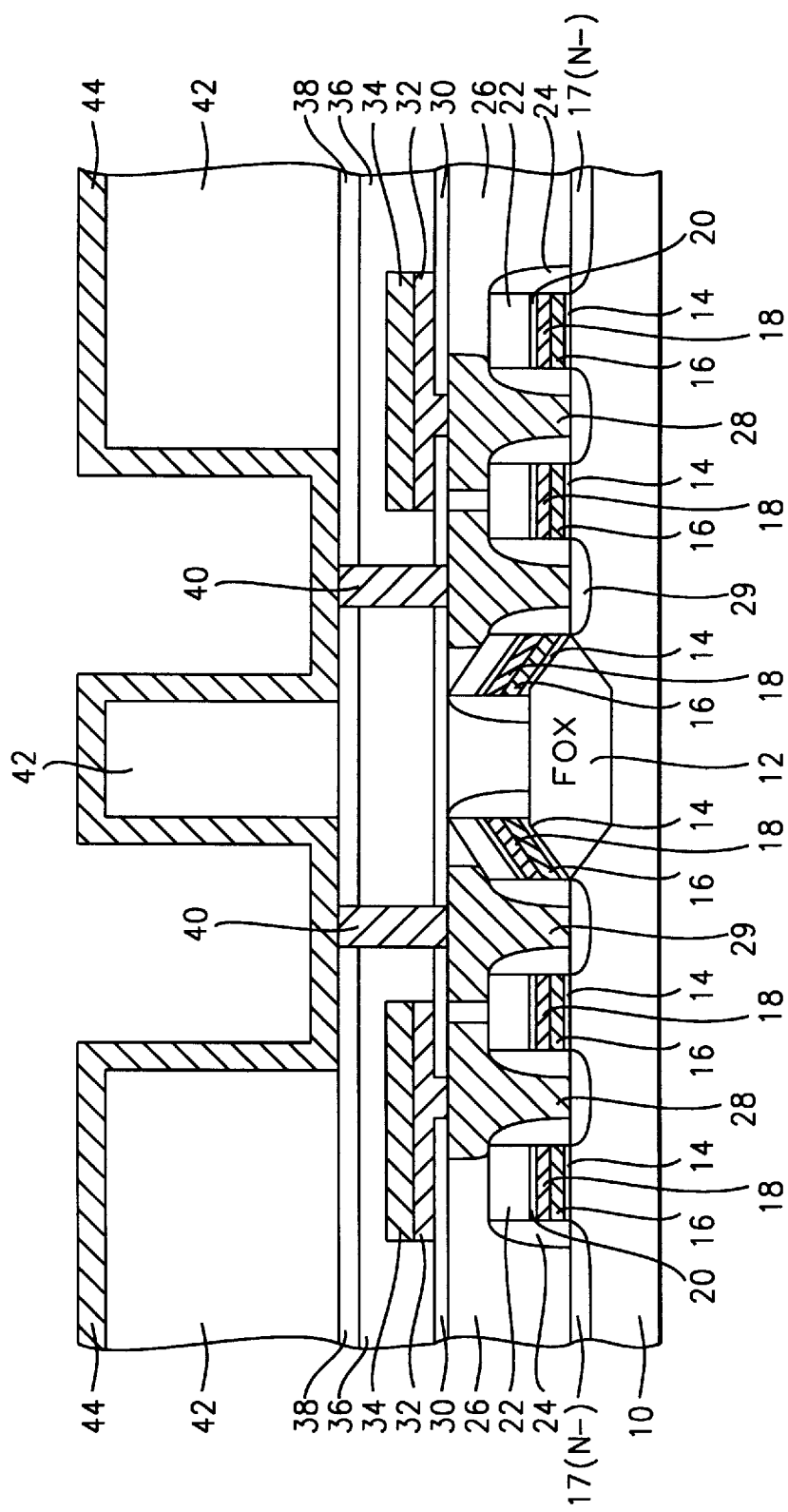

Referring to FIG. 10, a conformal first conducting layer 44 is deposited. Layer 44 is preferably a doped polysilicon, deposited by LPCVD using, for example, $SiH_4$ as the reactant gas, and is doped in situ with phosphorus by adding a dopant gas such as phosphine ($PH_3$). Layer 44 is deposited to a thickness of between about 500 and 1000 Angstroms, and is doped to a concentration of between about 1.0 E 19 and 1.0 E 22 atoms/$cm^3$.

Figure 11:
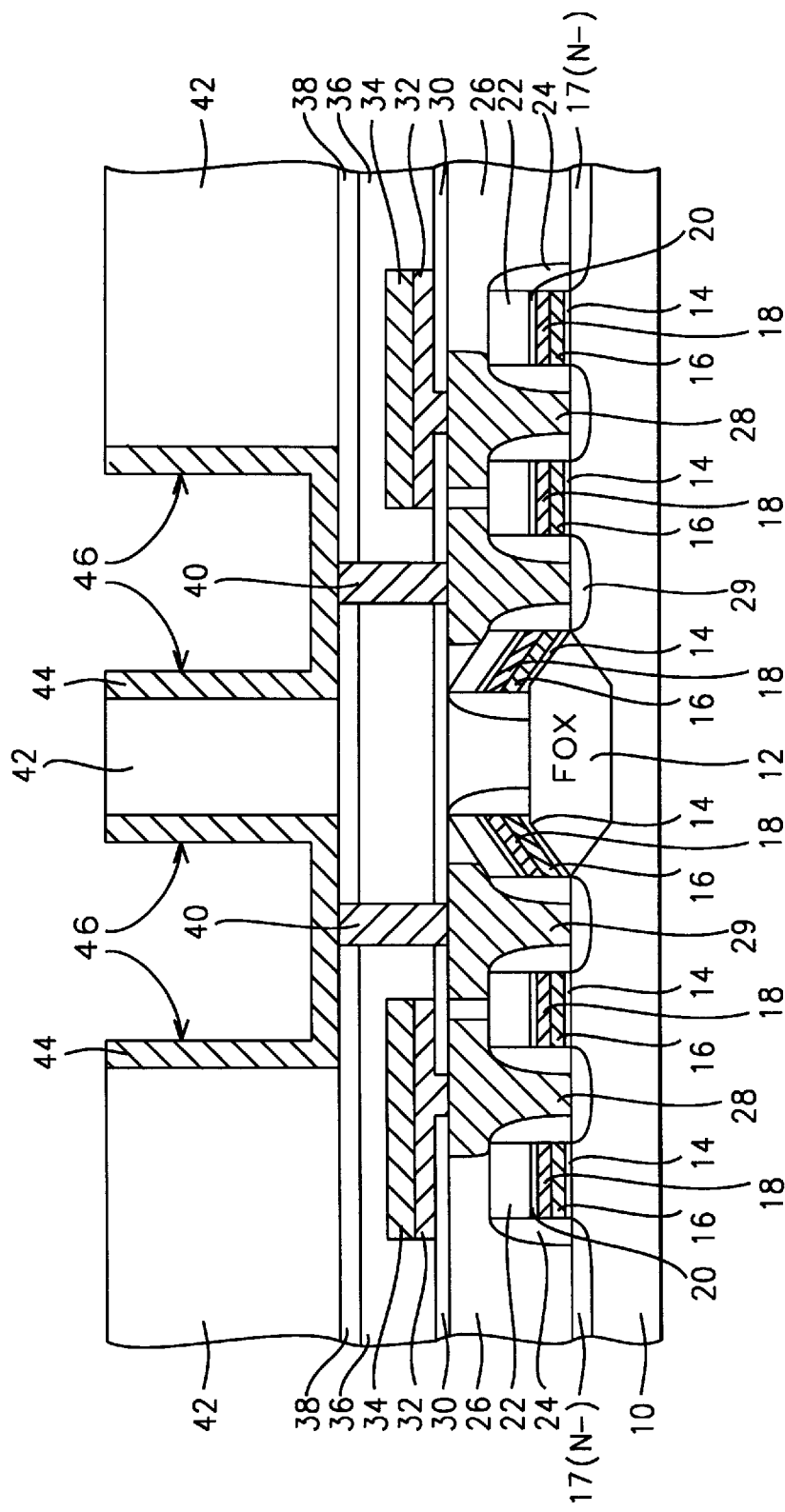

Referring to FIG. 11, the first conducting layer 44 is polished back to the surface of the low-k fourth insulating layer 42 to define an array of capacitor bottom electrodes, also labeled 44, in the recesses 8. The polishing is carried out using an appropriate polishing slurry and endpoint-detect to stop at layer 42.

Referring still to FIG. 11, a thin interelectrode dielectric layer 46, that has a high dielectric constant (high-k), is formed on the array of bottom electrode 44. The dielectric layer 46 is preferably composed of layers of $SiO_2/Si_3N_4/SiO_2$ (ONO). The ONO dielectric layer can be formed by first growing a thin thermal oxide (e.g., 5 Angstroms) on the polysilicon bottom electrodes 44. A $Si_3N_4$ layer is deposited by LPCVD. Then a thin $SiO_2$ is formed using an oxidation furnace to partially reduce the $Si_3N_4$ layer to form a top $SiO_2$ layer that provides a pin-hole-free ONO layer. The effective thickness of the ONO is about 35 to 50 Angstroms. Alternatively, the dielectric layer 46 can be other high-dielectric constant materials, such as tantalum pentoxide ($Ta_2O_5$) or can be used in conjunction with ONO to form the high-dielectric-constant layer 46.

Figure 12:
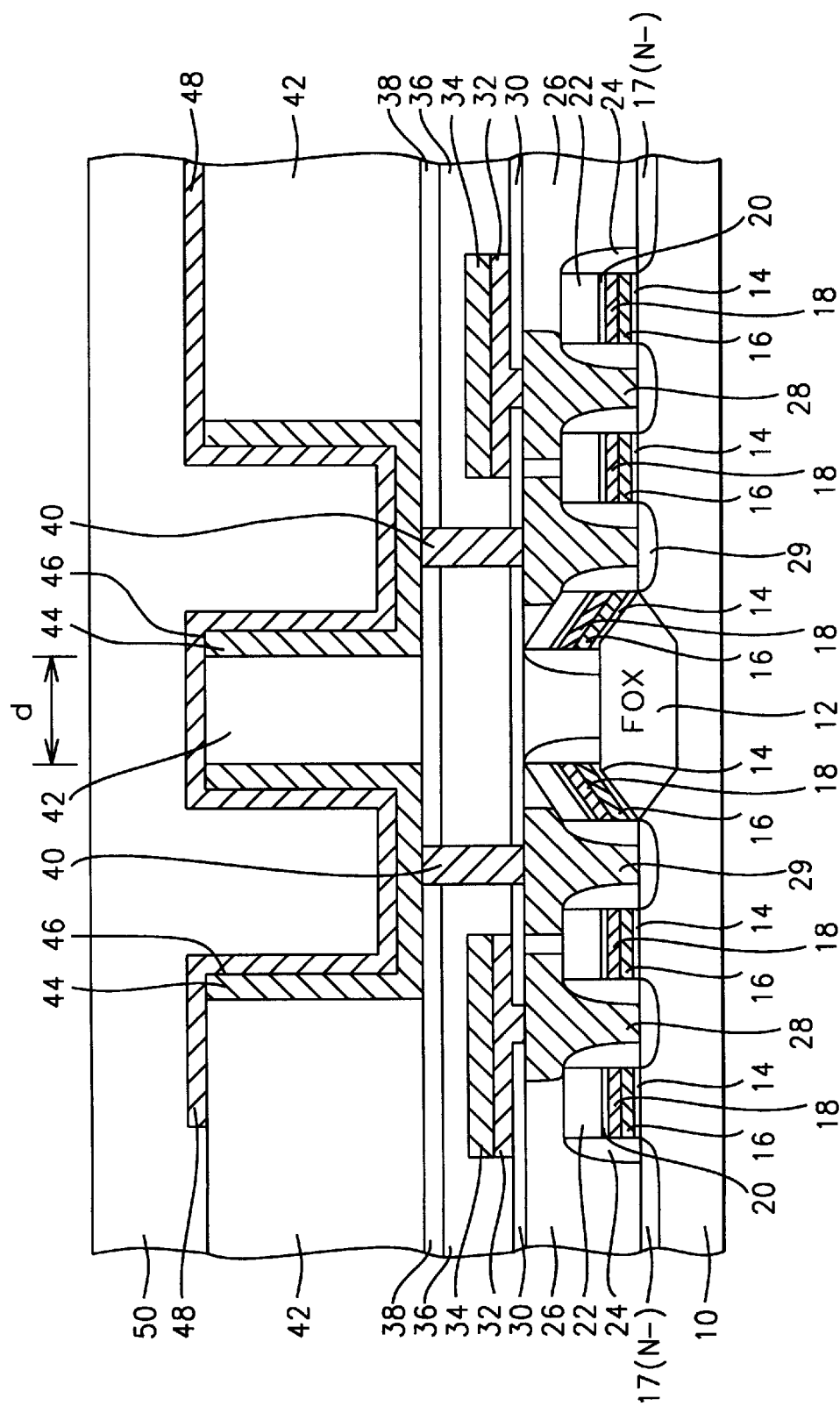

Referring to FIG. 12, the array of crown capacitors is now completed by depositing a conformal second conducting layer 48. Layer 48 is preferably an in-situ doped polysilicon layer and is deposited by LPCVD using a reactant gas such $SiH_4$, and using a dopant gas such as $PH_3$. The polysilicon layer 48 is doped $N^+$ to a preferred concentration of between about 1.0 E 19 and 1.0 E 22 atoms/$cm^3$. The preferred thickness of the polysilicon layer 48 is between about 2000 and 5000 Angstroms. Layer 48 is then patterned to form the capacitor top electrodes. A fifth insulating layer 50 is deposited sufficiently thick to electrically insulate the array of capacitors on the DRAM device prior to subsequent processing to complete the DRAM device. Layer 50 is $SiO_2$, deposited by LPCVD. The fifth insulating layer 50 is deposited to a thickness of between about 3000 and 5000 Angstroms.

Still referring to FIG. 12, and to better appreciate the advantages of this invention, the parasitic capacitance between adjacent crown capacitors is substantially reduced by the low-k-dielectric-material insulating layer 42. In future products having minimum feature sizes of about 0.25 micrometers (um) and is expected to further decrease to about 0.18 um and even smaller, the spacings d (FIG. 12) between adjacent capacitors will also decrease. Since the parasitic capacitance $C_p$ varies inversely with d, as described above in the prior art ($C_p$=kA/d), when d decreases for a constant k, the $C_p$ increases. By the method of this invention, by reducing the dielectric constant k of insulating layer 42, the spacing d can be further reduced without increasing the parasitic capacitance. For example, if the dielectric constant k is reduced by 50 percent (e.g., k is reduced from 4 to 2), then the spacing d can also be decreased by 50 percent without increasing $C_p$.

While the invention has been particularly shown and described with reference to the preferred embodiment thereof, it will be understood by those skilled in the art that various changes in form and details may be made without departing from the spirit and scope of the invention.

What is claimed is:

1. A method for fabricating an array of capacitors on a dynamic random access memory (DRAM) device comprising the steps of:

providing a semiconductor substrate having field oxide areas surrounding device areas and said device areas having semiconductor devices;

depositing a first insulating layer over said device areas and said field oxide areas;

planarizing said first insulating layer;

etching first contact openings for bit lines and for an array of capacitor node contacts in said first insulating layer to said device areas;

depositing a first polysilicon layer on said first insulating layer sufficiently thick to fill said first openings and etching back said first polysilicon layer to said first insulating layer to form bit-line plugs and capacitor node contact plugs in said first openings;

depositing a second insulating layer over said first insulating layer and over said bit-line plugs and said capacitor node contact plugs;

etching second openings in said second insulating layer to said bit-line plugs for bit lines;

depositing a polycide layer over said second insulating layer and patterning to form said bit lines over said bit-line plugs;

forming a planar third insulating layer over said bit lines;

depositing an etch-stop layer on said third insulating layer;

etching third openings in said etch-stop layer and in said third and said second insulating layers to said capacitor node contact plugs;

depositing a second polysilicon layer sufficiently thick to fill said third openings and etching back said second polysilicon layer to said etch-stop layer to form polysilicon plugs to said capacitor node contact plugs;

depositing a fourth insulating layer on said etch-stop layer, wherein said fourth insulating layer is a low-dielectric material;

forming an array of recesses in said fourth insulating layer aligned over and to said polysilicon plugs that contact said array of capacitor node contacts plugs;

depositing a conformal first conducting layer and polishing back to form capacitor bottom electrodes in said recesses;

forming an interelectrode dielectric layer on said bottom electrodes;

depositing and patterning a second conducting layer to form capacitor top electrodes;

depositing a fifth insulating layer to electrically insulate and to complete said array of capacitors on said DRAM device.

2. The method of claim 1, wherein said first insulating layer is composed of silicon oxide and is deposited to a thickness of between about 3000 and 8000 Angstroms.

3. The method of claim 1, wherein said first polysilicon layer is conductively doped to a concentration of between about 1.0 E 19 and 1.0 E 23 ions/$cm^3$.

4. The method of claim 1, wherein said second insulating layer is silicon oxide deposited to a thickness of between about 500 and 2000 Angstroms.

5. The method of claim 1, wherein said polycide layer is composed of a conductively doped polysilicon layer having a thickness of between about 300 and 1000 Angstroms, and an upper refractory metal silicide layer having a thickness of between about 500 and 2000 Angstroms.

6. The method of claim 1, wherein said third insulating layer is silicon oxide deposited to a thickness of between about 3000 and 6000 Angstroms.

7. The method of claim 1, wherein said etch-stop layer is silicon nitride and is deposited to a thickness of between about 40 and 100 Angstroms.

8. The method of claim 1, wherein said second polysilicon layer is conductively doped to a concentration of between about 1.0 E 19 and 1.0 E 23 ions/cm$^3$.

9. The method of claim 1, wherein said low-dielectric material has a dielectric constant between about 2 and 4, and is deposited to a thickness of between about 5000 and 12000 Angstroms.

10. The method of claim 9, wherein said low-dielectric material is a fluorosilicate glass.

11. The method of claim 1, wherein said first conducting layer is a doped polysilicon layer deposited to a thickness of between about 500 and 1000 Angstroms, and wherein said interelectrode dielectric layer is composed of silicon oxide/silicon nitride/silicon oxide (ONO) and has an effective thickness of between about 35 and 50 Angstroms.

12. The method of claim 1, wherein said second conducting layer is a doped polysilicon deposited to a thickness of between about 2000 and 5000 Angstroms.

13. The method of claim 1, wherein said fifth insulating layer is silicon oxide deposited to a thickness of between about 3000 and 5000 Angstroms.

14. A method for fabricating an array of closely spaced capacitors on a dynamic random access memory (DRAM) device comprising the steps of:

providing a semiconductor substrate having field oxide areas surrounding and electrically isolating an array of device areas, each of said device areas having a field effect transistor (FET) having a gate electrode and having a first and second source/drain area, one on each side and adjacent to said gate electrode;

depositing a first insulating layer over said device areas and said field oxide areas;

planarizing said first insulating layer;

etching first contact openings for bit lines and for capacitor node contacts in said first insulating layer to said source/drain areas in said device areas, wherein said first contact openings are self-aligned to said gate electrodes;

depositing a first polysilicon layer on said first insulating layer sufficiently thick to fill said first openings and etching back said first polysilicon layer to said first insulating layer to form bit-line plugs to said first source/drain areas, and to form capacitor node contact plugs to said second source/drain areas;

depositing a second insulating layer over said first insulating layer and over said bit-line plugs and said capacitor node contact plugs;

etching second openings in said second insulating layer to said bit-line plugs for bit lines;

depositing a polycide layer over said second insulating layer and patterning to form said bit lines over said bit-line plugs;

forming a planar third insulating layer over said bit lines;

depositing an etch-stop layer on said third insulating layer;

etching third openings in said etch-stop layer and in said third and said second insulating layers to said capacitor node contact plugs;

depositing a second polysilicon layer sufficiently thick to fill said third openings and etching back said second polysilicon layer to said etch-stop layer to form polysilicon plugs to said capacitor node contact plugs;

depositing a fourth insulating layer, having a low dielectric constant, on said etch-stop layer;

forming an array of recesses in said fourth insulating layer aligned over and to said polysilicon plugs that contact said array of capacitor node contacts plugs;

depositing a conformal first conducting layer and polishing back to form capacitor bottom electrodes in said recesses;

forming an interelectrode dielectric layer on said bottom electrodes;

depositing and patterning a second conducting layer to form capacitor top electrodes;

depositing a fifth insulating layer to electrically insulate said array of capacitors on said DRAM device.

15. The method of claim 14, wherein said first insulating layer is composed of silicon oxide and is deposited to a thickness of between about 3000 and 8000 Angstroms.

16. The method of claim 14, wherein said first polysilicon layer is conductively doped to a concentration of between about 1.0 E 19 and 1.0 E 23 ions/cm$^3$.

17. The method of claim 14, wherein said second insulating layer is silicon oxide deposited to a thickness of between about 500 and 2000 Angstroms.

18. The method of claim 14, wherein said polycide layer is composed of a conductively doped polysilicon layer having a thickness of between about 300 and 1000 Angstroms, and an upper refractory metal silicide layer having a thickness of between about 500 and 2000 Angstroms.

19. The method of claim 14, wherein said third insulating layer is silicon oxide deposited to a thickness of between about 3000 and 6000 Angstroms.

20. The method of claim 14, wherein said etch-stop layer is silicon nitride and is deposited to a thickness of between about 40 and 100 Angstroms.

21. The method of claim 14, wherein said second polysilicon layer is conductively doped to a concentration of between about 1.0 E 19 and 1.0 E 23 ions/cm$^3$.

22. The method of claim 14, wherein said fourth insulating layer is a material having a low-dielectric constant between about 2 and 4, and is deposited to a thickness of between about 5000 and 12000 Angstroms.

23. The method of claim 22, wherein said low-dielectric material is a fluorosilicate glass.

24. The method of claim 14, wherein said first conducting layer is a doped polysilicon layer deposited to a thickness of between about 500 and 1000 Angstroms, and wherein said interelectrode dielectric layer is composed of silicon oxide/silicon nitride/silicon oxide (ONO) and has an effective thickness of between about 35 and 50 Angstroms.

25. The method of claim 14, wherein said second conducting layer is a doped polysilicon deposited to a thickness of between about 2000 and 5000 Angstroms.

26. The method of claim 14, wherein said fifth insulating layer is silicon oxide deposited to a thickness of between about 3000 and 5000 Angstroms.

* * * * *